United States Patent
Chen

(10) Patent No.: US 8,699,249 B1
(45) Date of Patent: Apr. 15, 2014

(54) COMPENSATION SCHEMES FOR THE VOLTAGE DROOP OF SOLID-STATE MARX MODULATORS

(71) Applicant: Ping Chen, Rancho Palos Verdes, CA (US)

(72) Inventor: Ping Chen, Rancho Palos Verdes, CA (US)

(73) Assignee: DULY Research Inc., Rancho Palos Verdes, CA (US)

( * ) Notice: Subject to any disclaimer, the term of this patent is extended or adjusted under 35 U.S.C. 154(b) by 0 days.

(21) Appl. No.: 14/142,747

(22) Filed: Dec. 27, 2013

Related U.S. Application Data

(63) Continuation of application No. 13/507,589, filed on Jul. 10, 2012, now abandoned.

(51) Int. Cl.
*H02M 3/18* (2006.01)
*H02M 7/00* (2006.01)

(52) U.S. Cl.
USPC ............................................. 363/60; 307/110

(58) Field of Classification Search
USPC ...................... 363/60; 320/166; 307/108, 110
See application file for complete search history.

(56) References Cited

U.S. PATENT DOCUMENTS

| | | | | |
|---|---|---|---|---|
| 6,058,029 | A * | 5/2000 | Itow et al. | 307/110 |
| 7,855,904 | B2 * | 12/2010 | Kirbie et al. | 363/60 |
| 2004/0080964 | A1 * | 4/2004 | Buchmann | 363/60 |
| 2006/0139977 | A1 * | 6/2006 | Oicles et al. | 363/71 |
| 2006/0245217 | A1 * | 11/2006 | Kirbie et al. | 363/60 |
| 2009/0184585 | A1 * | 7/2009 | Hartmann | 307/108 |

* cited by examiner

*Primary Examiner* — Jue Zhang

(57) ABSTRACT

A novel design scheme for the compensation circuitry of solid-state Marx modulators has been described for enhancing the compensation ability of the compensation cells of solid-state Marx modulators and simplifying the entire circuitry of the modulator. High-speed solid-state switches are adopted in the new compensation cell for the control of the compensation actions. Inductive components and diodes are adopted in the design scheme to smooth the flattop of the voltage pulse output by the Marx modulator.

4 Claims, 9 Drawing Sheets

COMPENSATION SCHEMES FOR THE VOLTAGE DROOP OF SOLID-STATE MARX MODULATORS

RELATED APPLICATIONS

This is a continuation application of U.S. patent application Ser. No. 13/507,589 which was filed on Jul. 10, 2012 and which is entitled "COMPENSATION SCHEMES FOR THE VOLTAGE DROOP OF SOLID-STATE MARX MODULATORS".

GOVERNMENT RIGHTS

This invention was made with government support under Grant No. DE-FG02-08ER85052 awarded by the U.S. Energy Department. The government may have certain rights in the invention.

BACKGROUND OF THE INVENTION

1. Field of the Invention

This invention comprises a new design scheme for a compensation circuitry for the output voltage pulse of a solid-state Marx modulator. Specifically, design and utilization methods of high voltage compensation cells (HVCCs) are introduced into a high-voltage solid-state Marx modulator for counteracting the voltage droop of its output pulse when the Marx modulator is used in high-power and long-pulse applications. Inductive components regulated by solid-state switches are used in the HVCCs for reliably compensating the voltage droop of the long output pulse (around millisecond order) of the Marx modulator. The invention is also applicable to solid-state Marx pulsers that have a large voltage droop in output voltage pulses.

2. Description of Prior Art

A Marx generator is a device to transform a low charge voltage to a high output voltage pulse. It is a robust, low-impedance source of electric energy that has been utilized in a variety of high-peak-power applications for the past several decades. In recent years, Marx generators using new solid-state switches, e.g. Metal Oxide Semiconductor Field Effect Transistors (MOSFET) and Insulated Gate Bipolar Transistor (IGBT), have been studied for the application of high voltage modulators. This type of modulators, called solid-state Marx modulators or Marx modulators in short, offers an alternative to traditional high voltage (HV) modulators for rf power sources. Their merits are compact size, high-energy efficiency, high reliability, pulse width control and cost reduction. The use of solid-state switches with electrical current interruption capability, in place of spark gap switches or Silicon-Controlled Rectifier (SCR) switches, gives Marx modulators the ability to produce square-shaped output pulses at high repetition rates, and allows the output pulse to change width from one pulse to the next, a capability that gives Marx modulators the ability to adapt rapidly to changing load requirements.

Ideally, the high voltage output pulse by the Marx modulator should have a constant amplitude (or flat pulse) in rf applications. There is no intrinsic limitation for the Marx modulator to generate a flat pulse if its output voltage pulse is short or if the resistance of the Marx modulator's load is high so that their circuit's time constant is much longer than the pulse length. However, a great challenge appears if the Marx modulator has a long output pulse or a small load. The output voltage droops significantly in the latter cases because, when discharging, a Marx modulator can be approximated by a simple capacitor having the capacitance of $C_m$, if parasitic inductance is small, with the load represented by a resistance $R_L$. The entire modulator circuit together with its load, e.g. a klystron or a magnetron, is a simple discharging RC circuit with a time-constant $t = C_m \cdot R_L$, which determines the severity of the voltage droop at the end of a voltage pulse. A reduction in the time constant or an increase of the voltage pulse duration would lead to a significant voltage reduction at the end of a long voltage pulse, which is generally not acceptable for an rf load such as a klystron. To limit the voltage droop in a narrow range that is required by the load, designers of the Marx modulator need to increase the time-constant t. Since the load is normally not changeable, the total capacitance, $C_m$, of the Marx modulator need to be increased dramatically, which is equivalent to increasing the total stored electrical energy of the Marx modulator and will incur a great amount of expense.

To circumvent this problem, researchers tried to exploit compensation circuitry to reduce the voltage droop of the Marx modulators (precisely, the Marx cell bank of the Marx modulator, see below) in recent years. The prior art compensation circuitry, named vernier regulator or VC bank, consists of tens of compensation cells (CCs), called vernier cells (VCs) (see papers of G. Leyh, 2005 Pulsed Power Conference, Particle Accelerator Conference 2007 and C. Burkhart, Proceedings of LINAC 2008). These prior art CCs, i.e. VCs, have a similar topology to that of the Marx cells (MCs) within same Marx modulator, but have much lower charge voltage than that of the MCs (see papers of C. Burkhart, Proceedings of LINAC 2008, and G. Leyh, 2005 Pulsed Power Conference, European Particle Accelerator Conference 2004). Therefore, the voltage rating of the components of the VCs is generally much lower than their counterpart in MCs.

For the purpose of discussing the differences between our invention and prior arts, we display a topology of a MC described in above citations in FIG. 1, which has a similar topology to a prior art CC or VC. The charging circuit for the cells is represented by a solid-state charge switch only in FIG. 1, omitting other details in order to highlight the core function of the cell. Isolated switch drives are included in the figure because they are necessary for the solid-state switches exploited by Marx modulators. In this prior art topology, the MC or VC comprises of charge switch 16 together with its isolated switch drive 22 (also called isolated gate drive; same for other isolated switch drives), bypass diode 18, main switch 12 together with its isolated switch drive 20, and energy storage capacitor 14. Bypass diode 18 defaults the current cell if main switch 12 is off during pulse output period. Isolated switch drive 20 and 22 accept the control signals from a control system of the Marx modulator. When charging, main switch 12 is off and charge switch 16 is on. Charge current passes through charge switch 16 to charge energy storage capacitor 14 that is in the next MC in series. During operation, charge switch 16 is turned off while main switch 12 is turned on by the control system through their individual isolated switch drives. Electric energy stored in energy storage capacitor 14 is released to the Marx modulator's load.

When working in a Marx modulator, prior art VCs with the topology in FIG. 1 are turned on one-by-one within the specified pulse duration. Their output voltages are superposed on the negative output voltage of the MC bank, comprising tens of MCs in series, so that the voltage droop (referring to voltage amplitude droop, same meaning below) of the MC bank is compensated. The advantage of using a compensation circuitry in a high voltage modulator is that the Marx modulator can greatly reduce the stored electric energy in the capacitors of its MC bank while still limiting its pulsed voltage droop to the specified range required by the rf load. However, problems exist in these compensation cell designs. First, the output voltage of the compensation cells, i.e. the VCs mentioned above, in series of the MC bank of the Marx modulators superposes on the output voltage of the MC bank, and forms sawtooth shapes (see paper of C. Burkhart, Proceedings of LINAC 2008) on the output voltage pulse of the entire Marx modulator. The charge voltage of each of the VCs must be lowered in order to control the sawtooth height, necessitating a large difference between the charge voltage of a MC and that of a VC. Thus more than one charge source would need to be employed in the same Marx generator. Second, the VCs cannot provide flexible compensation. Only at a pre-set time interval a VC is switched on. Third, many VCs are needed for a Marx modulator with a long output pulse because the VC's storage energy is low and its compensation ability is limited by the low voltage. Fourth, the low charge voltage results in large ohmic loss due to increased charge current, thus diminishing the efficiency, or the energy utilization ratio. All of these problems not only complicate the circuit design, but also increase the cost of the circuitry with uncertain compensation results because a plurality of VCs in the compensation circuitry increase the parasitic inductance and may cause uncontrollable fluctuation during the flat top of the pulsed voltage output. Furthermore, the footprint of the Marx modulator expands as more VCs are added. Each VC is an integrated circuit which is utilized only once during one voltage pulse output.

The present invention provides a new way of compensating the voltage droop of the MC banks of the Marx modulators by enhancing the electric energy storage and utilization of the compensation cells (CCs), while reducing the number of CC units in the Marx modulators, resulting in smaller footprint and lower fabrication cost. Further objectives and advantages of the invention will become apparent from a consideration of the drawings and ensuing description.

SUMMARY OF THE INVENTION

Solid-state switches can turn on/off thousands of times or more per second if their on/off time is on the order of microsecond or shorter. The present invention provides a high voltage compensation cell (HVCC) design for the voltage droop compensation of solid-state Marx modulators, incorporating the advantages of the fast speed of electrically triggered solid-state switches which are easy to operate and have the ability of electrical current interruption, with additional inductive component to resist any abrupt change of current in the circuitries. The compensation voltage output by a HVCC is smoothly raised to match the voltage droop of the MC bank of the Marx modulator and maintain a flat voltage output of the entire Marx modulator. The HVCCs designed with the scheme in the present invention have a charge voltage as high as that of the MCs of the Marx modulators, thus eliminating the need for additional charge voltage source, as in the vernier regulator. The HVCCs have high stored electric energy, so a single HVCC can actively compensate the voltage droop of the MC bank of the Marx modulator in multiple times and provide higher compensation voltage.

The new compensation circuitry that utilizes HVCCs in series as a HVCC bank operates with an intelligent control system. An example of the intelligent control systems is a computer control system with the capability of voltage variation detection and feedforward correction (see paper of D. Yu, Particle Accelerator Conference 1993). If the voltage of the MC bank of the Marx modulator droops to a level that a compensation action is needed, the intelligent control system will trigger the solid-state switches of a HVCC to release its electric energy. The inductive components in the compensation circuitry of the HVCC will prevent its entire voltage from adding all at once to that of the MC bank of the Marx modulator, thus narrow the pulse flattop fluctuation range and smooth out the voltage compensation actions. Said controllable compensation actions can be repeated many times as long as the stored energy in the compensation circuitry remains sufficient. Using this multiple compensation principle, the number of CCs is reduced and the design of the compensation circuitry is simplified. The voltage droop of the MC banks of the Marx modulators is controlled within the range required by their loads.

Two embodiments of the HVCC are disclosed in the present invention. The first embodiment is a HVCC with a topology modified and improved from that of a MC of the Marx modulator. Two additional components, i.e. an inductor and a diode, are added in the HVCC for controlling the compensation energy flow and smoothing the compensation voltage. The second embodiment is a HVCC that utilizes a buck converter circuit, which is often used for DC-to-DC voltage conversion in circuit design. Both embodiments comprise inductive components, diodes, capacitors and fast speed solid-state switches, and are controlled by intelligent control systems.

The present invention applies to designing a compensation circuitry of long-pulse Marx modulators which are used by particle accelerators and radars, and Marx pulsers that output high voltage pulses used in weapon effect simulators, fusion research devices, lasers etc. The invention also applies to a Marx pulser operating with a small load or outputting a long pulse. The compensation circuitry comprising a HVCC bank that has a plurality of HVCCs in series enables an entire Marx modulator to maintain a constant voltage output. In addition to these applications, the compensation scheme in the present invention applies to low-voltage pulsers with several kilovolts or less, as the compensation circuitries can be easily scaled down.

DESCRIPTION OF THE DRAWINGS

For a better understanding of the present invention and further features thereof, reference is made to the following descriptions which are to be read in conjunction with the accompanying drawings wherein.

DESCRIPTION OF THE INVENTION

Figure 1:
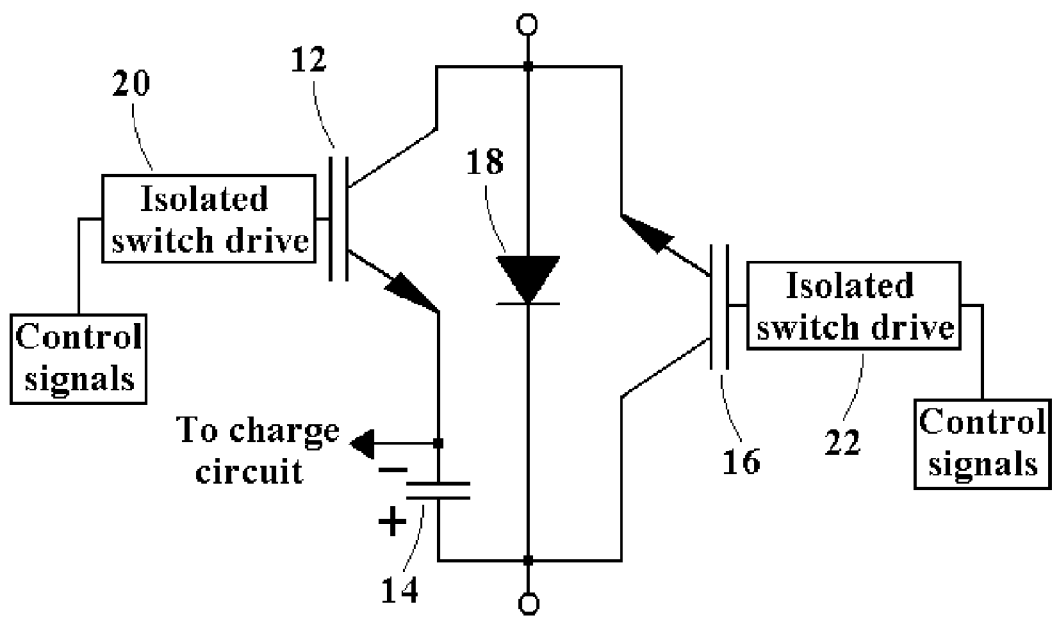
FIG. 1 is a prior art compensation cell (CC), identical to a Marx cell (MC) topologically.

For compensating the voltage droop of a solid-state Marx modulator, a CC bank having a plurality of CCs in series is needed. The number of CCs that are needed in a CC bank of a solid-state Marx modulator can be determined as follows. The energy stored in a CC bank should at least make up the energy difference between the energy absorbed by a Marx modulator's load when the Marx modulator outputs an ideal voltage pulse, and the actual, decayed voltage pulse for which the Marx modulator is absent of any CC bank in series of its MC bank. Based on this principle, the following calculations yield the number of CCs needed:

(1) Energy Deposited on a Marx Modulator's Load when the Marx Modulator has Only a MC Bank with No Compensation The voltage V(t) output by a MC bank having a total capacitance C and a load impedance R in series with the bank attenuates in time according to:

$$V(t) = V_0 e^{-\frac{t}{RC}}, \quad (1)$$

where $V_0$ is the initial output voltage amplitude of the MC bank, equal to the dc charge voltage times the number of the MCs erected, and t is discharging time or pulse length. The output power P(t) of the MC bank decays in a form of:

$$P(t) = \frac{V(t)^2}{R}. \quad (2)$$

If E(t) is the total energy dissipated in the load R, then:

$$E(t) = \int_0^t P(t)dt = \frac{1}{2} \times C \times V_0^2 \left(1 - e^{-\frac{2t}{RC}}\right). \quad (3)$$

(2) Energy Dissipation on a Marx Modulator's Load During an Ideal Rectangular Voltage Pulse with Compensation For an ideal rectangular voltage pulse (amplitude of $V_0$), the energy $E_r(t)$ of the pulse loss in the load with an impedance of R is:

$$E_r(t) = \frac{V_0^2}{R} \times t. \quad (4)$$

(3) Energy Stored in One CC or VC, $E_v(t)$, is:

$$E_v(t) = \frac{1}{2} \times C_v \times V_v^2, \quad (5)$$

where $C_v$ is the capacitance and $V_v$ is the charge voltage of the CC.

(4) Minimum Number of CCs

The electric energy stored in a CC bank should make up the difference between $E_r(t)$ and E(t). Thus, the minimum number, N, of the CCs can be calculated from the equation below:

$$N = (E_r(t) - E(t))/E_v(t). \quad (6)$$

From Equation 3 to 6, it is seen that:

$$N \propto (V_0/V_v)^2. \quad (7)$$

Thus the minimum number, N, of CCs is inversely proportional to the amplitude square of the charge voltage, $V_v$, of the CCs. Increasing the charge voltage reduces the number of CCs, thus helping to simplify the Marx modulator and saving cost. In certain applications such as the International Linear Collider project, the flatness of an output voltage pulse of the Marx modulator must be within a very small range, e.g. 1% or less. This requires a very low charge voltage of a prior art CC, because the output voltage of the CCs, having an initial amplitude equivalent to the charge voltage of the CCs, will superimpose on the total output voltage of the Marx modulator. Thus many CCs for the Marx modulators are needed in this prior art scheme. The present invention incorporates fast speed solid-state switches, inductors and diodes into a HVCC to smooth the output voltage of the compensation circuit of the Marx modulators. It allows raising the charge voltage of a HVCC as high as that of the charge voltage of the MC. The HVCC circuit will regulate its stored electric energy before partially releasing it. This method significantly enhances the HVCC's efficiency to compensate Marx modulator's voltage droop while keeping the flattop fluctuation of the Marx modulator's output voltage pulse in a required small arrange. It therefore reduces the number of CCs utilized.

Figure 2A:
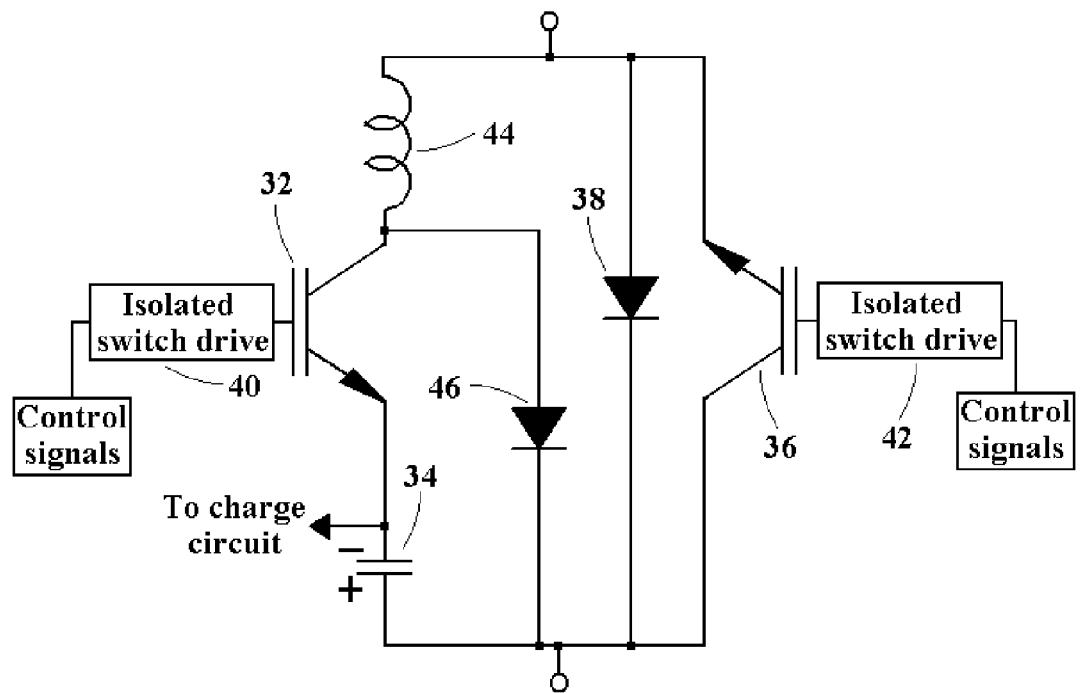
FIG. 2a is the first embodiment of the present invention.

FIG. 2a illustrates the first embodiment of the present invention of the high voltage compensation cell, or HVCC. The HVCC topology shown in FIG. 2a includes HVCC main switch 32 with its isolated switch drive 40, HVCC charge switch 36 with its isolated switch drive 42, HVCC energy storage capacitor 34, HVCC bypass diode 38, compensation inductor 44, and compensation diode 46. All of the isolated switch drives in the HVCC accept control signals from an intelligent control system of the Marx modulator, such as a computer control system and/or a feedforward system, which can detect the voltage variations on the Marx modulator's load through devices such as a voltage divider parallel to or in series of the load. The intelligent control system of the Marx modulator is not included in the HVCC topology in this figure since it controls the entire Marx modulator, not only a cell of the modulator. An example of the intelligent control system used in the integrated Marx modulator can be found in FIG. 4, where a single board computer is used as an intelligent control system. Compared to the topology of the MC or a prior art CC, two other important components are added in this HVCC topology, i.e. compensation inductor 44 and compensation diode 46, both of which are adopted for smoothing the compensation voltage abrupt change when HVCC main switch 32 is turned on, and for avoiding the interruption of compensation function when HVCC main switch 32 is turned off. With the aid of compensation inductor 44, HVCC main switch 32 is turned on/off multiple times by the intelligent control system during one voltage pulse output by the Marx modulator. The electric energy stored in the HVCC energy storage capacitor 34 is released partly during each on time of HVCC main switch 32, therefore the HVCC performs multiple times of compensation actions to the MC bank that is in series with it. Specifically, as the voltage pulse output by the Marx modulator droops, HVCC main switch 32 is turned on immediately by the intelligent control system of the Marx modulator. The voltage across HVCC energy storage capacitor 34 is added to the voltage of the MC bank in series gradually by means of the counteraction of compensation inductor 44. Once the output voltage of the entire Marx modulator recovers, HVCC main switch 32 is turned off, and the magnetic field energy stored in compensation inductor 44 continues to maintain the current through the inductor and the output voltage level of the MC bank, by outputting an equivalent voltage that we call post-compensation voltage to the prior compensation voltage across said compensation inductor 44; and the corresponding current under this voltage will go through compensation diode 46 to continuously power the load of the solid-state Marx modulator. The post-compensation voltage diminishes with time as the stored magnetic field energy is depleted, and the total voltage of the Marx modulator begins to droop again. When the total voltage reduces to a certain level, the compensation cycle is restarted over by the intelligent control system, as long as there is sufficient electric energy stored in HVCC energy storage capacitor 34, to compensate the voltage droop of the MC bank. Although the fall time of the voltage pulse output by the MC bank is affected by the inductance of compensation inductor 44, the compensation effect of the inductance is outpaced by the faster compensation action. The value of the inductance needed is therefore correlated to the switching speed of the solid-state switch. The faster is the speed of the solid-state switch, the less is the inductance of the HVCC needed. In summary, the HVCC having higher electric energy storage is exploited in a method that compensates the voltage droop of the MC bank of the solid-state Marx modulator in multiple times during one voltage pulse of the modulator.

Figure 2B:
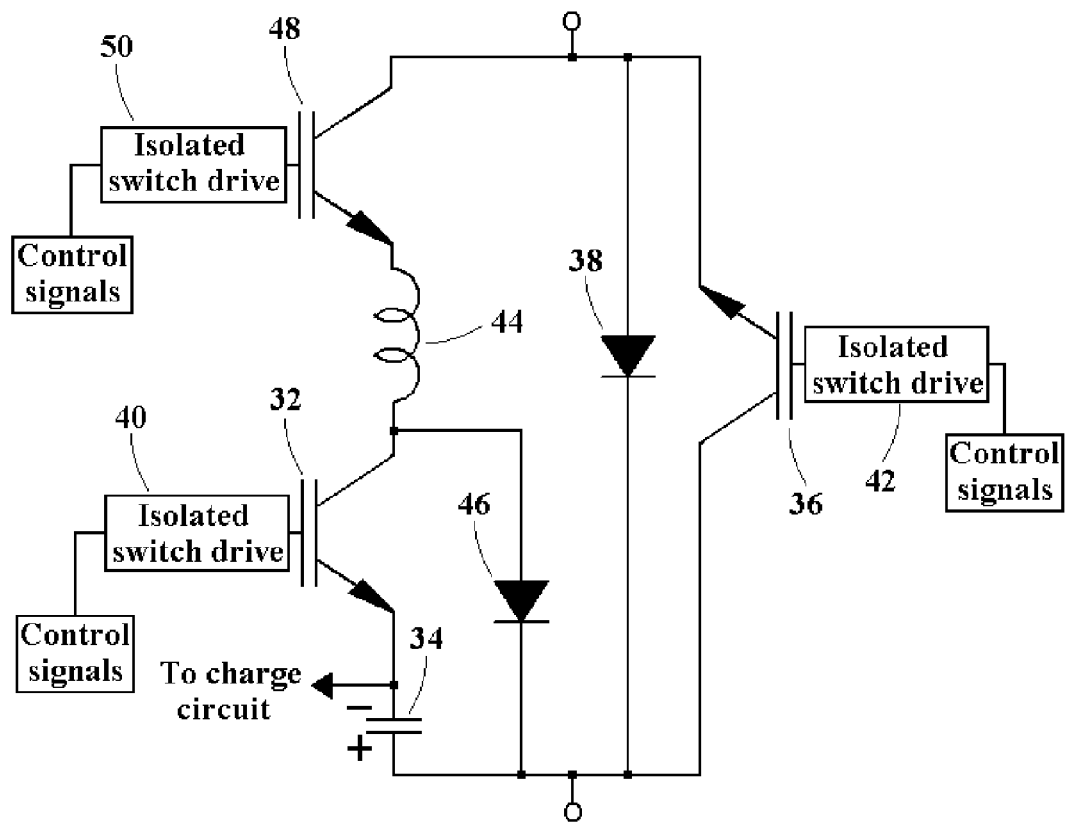
FIG. 2b is the first embodiment with an additional solid-state switch for protecting the load from arcing.

FIG. 2b describes an improvement of the compensation circuit in FIG. 2a. A third solid-state load protection switch 48 with its isolated gate drive 50 is added in the circuit for protecting the load of the Marx modulator, which may be an rf load such as a klystron. Load protection switch 48 is turned on when the HVCC begins to compensate, and turned off rapidly to cut off the current if there is load arcing, or it is turned off after the HVCC completes compensation. The switch does not otherwise contribute to normal compensation functions.

Figure 3A:
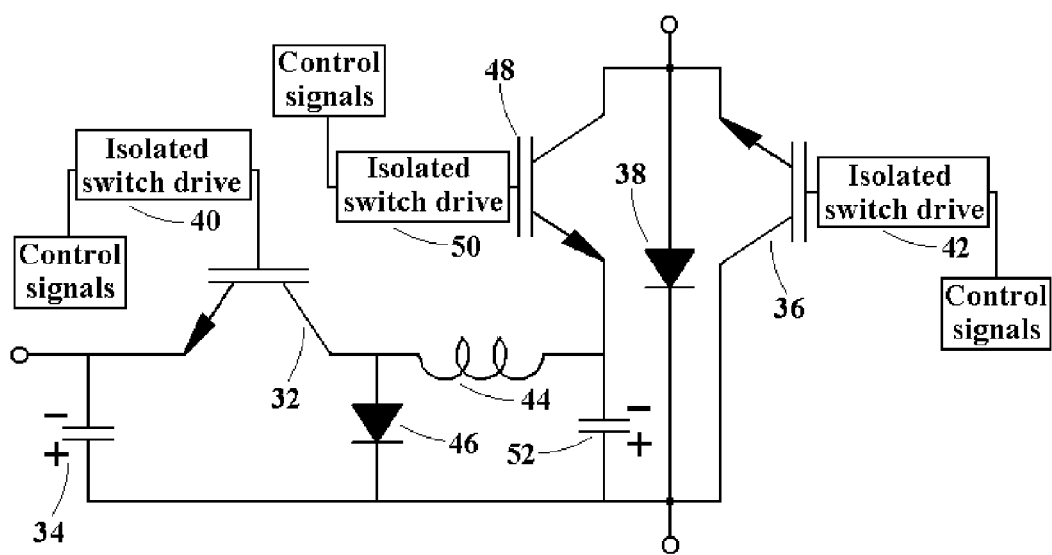
FIG. 3a is the second embodiment of the present invention.

FIG. 3a describes the second embodiment of the present invention. Compared with the first embodiment shown in FIGS. 2a and 2b, the second embodiment has similar topology but one more capacitor, which is direct compensation capacitor 52. The first embodiment is in fact a special case of the second one, with direct compensation capacitor 52 in the second embodiment having a value of zero. The purpose of direct compensation capacitor 52 is to alleviate the current load for compensation inductor 44 and compensation diode 46, because the current of the MC bank will pass through direct compensation capacitor 52.

Figure 3B:
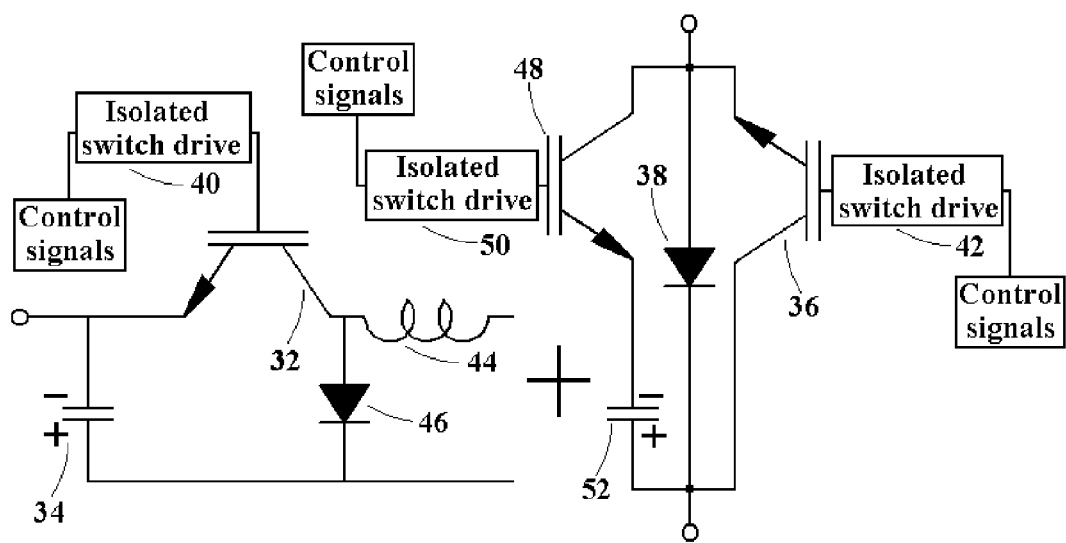
FIG. 3b is the second embodiment with an additional solid-state switch for protecting the load from arcing.

The second embodiment can be viewed in two separate parts (see FIG. 3b). The left part in FIG. 3b is a buck converter. When this part works in switching mode power supply (SMPS), it has a variable output voltage that is related to the voltage of HVCC energy storage capacitor 34 and the duty cycle of HVCC main switch 32. However, the SMPS mode is not used in compensation actions. Instead, in the present invention, HVCC main switch 32 is triggered by said intelligent control system through its isolated switch drive 40 whenever compensation is needed. HVCC energy storage capacitor 34 is charged to a high voltage, which can be identical to that of MC, so that it stores sufficient electric energy to be used in the ensuing compensation actions. The right part in FIG. 3b is the same as the topology of a MC, where direct compensation capacitor 52, in the position of energy storage capacitor 14 in FIG. 1, receives the regulated compensation energy from the left part and thus functions in a similar manner as said energy storage capacitor 14, with the distinction that voltage across direct compensation capacitor 52 will increase, not drop, along with time during compensation. The compensation energy flux, and thus the voltage of direct compensation capacitor 52, is adjusted through the triggering of HVCC main switch 32. Thus, the left part of the embodiment imparts electric energy to the right part under regulation so that the right part increases its output voltage gradually to compensate the voltage droop of the MC bank in series.

Preliminary Experiments

Figure 4:
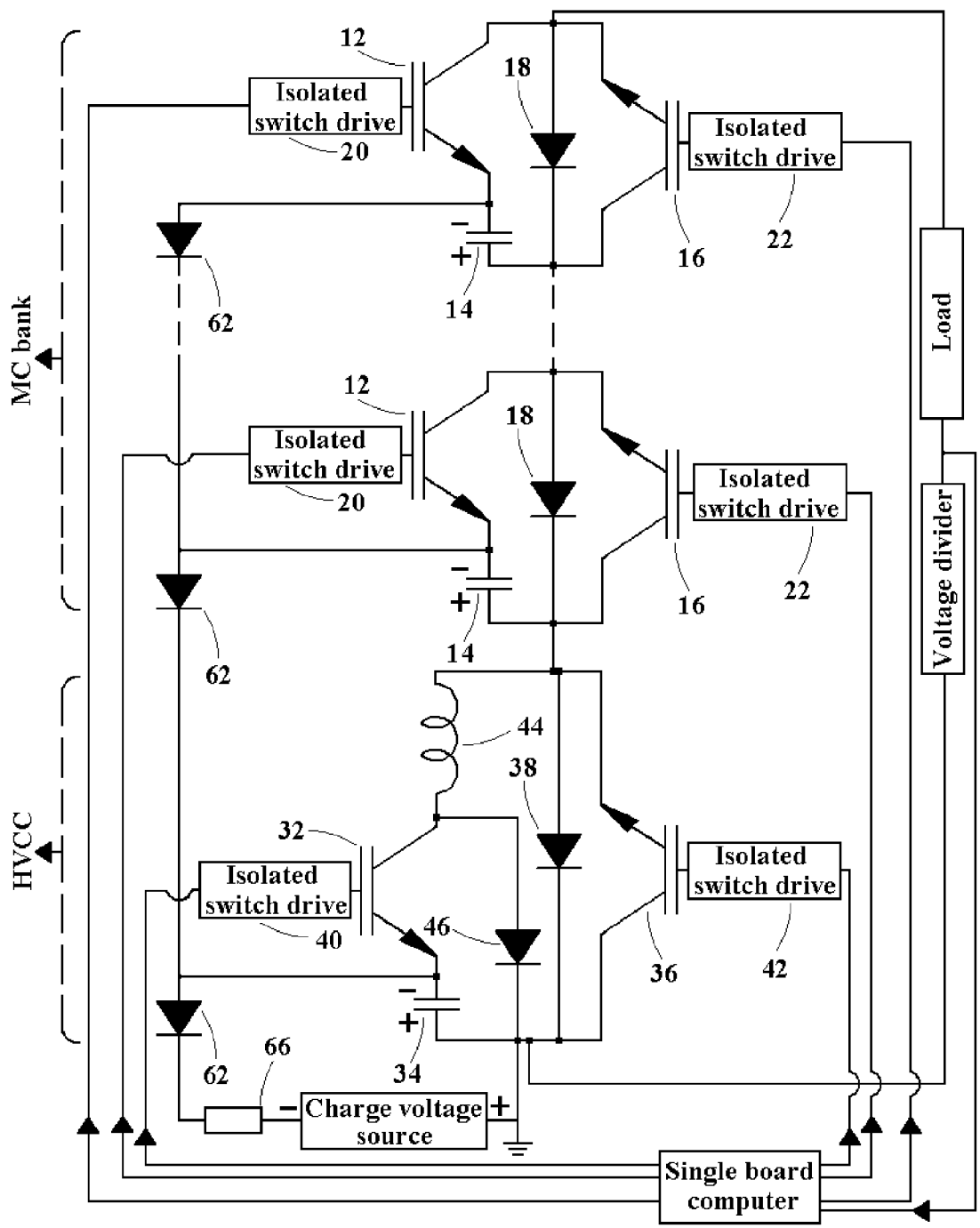
FIG. 4 is a schematic of a proof-of-principle experimental setup for the first embodiment.

Low-voltage experiments were performed for the compensation circuitry of the first embodiment (see FIG. 2a), in conjunction with a single Marx main cell. The experimental purpose was to prove the feasibility of the HVCC design scheme in the present invention, i.e. multiple compensations regulated by the solid-state switch and the inductor. For simplicity, only one HVCC was used in the test. The charge voltage of the HVCC was the same as that of the MCs. The capacitance of the HVCC was 30 µF. An MC bank (total in series capacitance of 3 µF) equivalent to 12 MCs in series was used. The MC bank was in series of the HVCC. Thirteen diodes 62 were used in charge circuits for both the MCs and the HVCC; the value for the charge current limited resistor 66 was 3 kΩ. The experimental setup is shown in FIG. 4. In the tests, all of the MCs and the HVCC adopted IGBT switches. The IGBT switches (rated at 100V) were driven by isolated switch drive circuits and controlled by a single-board computer. A voltage divider that was in series of the load was utilized to monitor the voltage change on the load and the voltage signal of the voltage divider was sent to the computer for the purpose of controlling HVCC main switch 32 to start the compensation actions.

Figure 5:
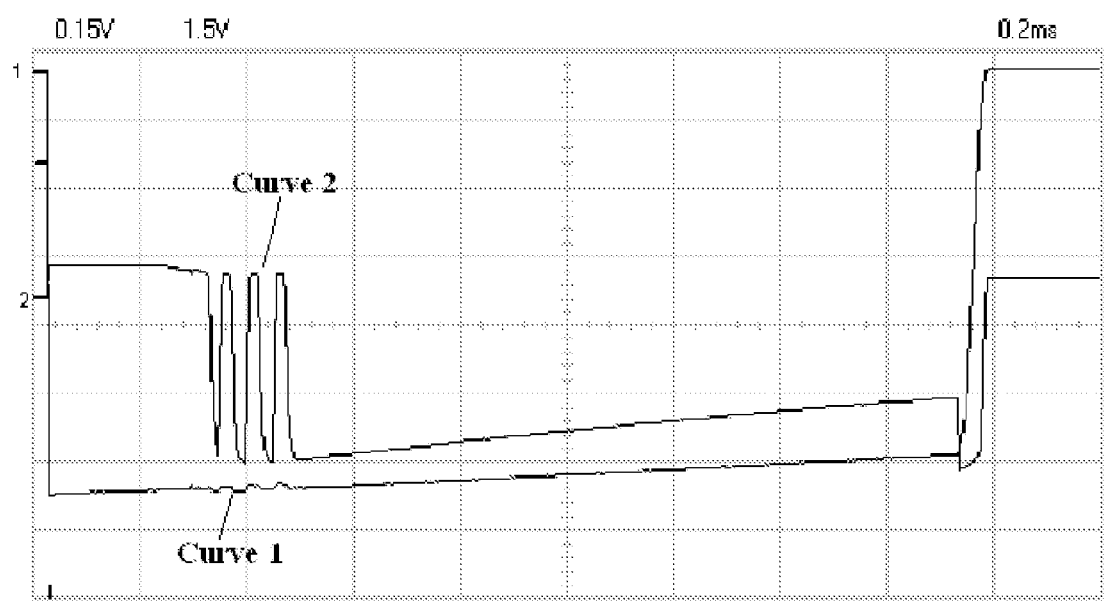
FIG. 5 shows the compensation action observed when the first embodiment was tested in the proof-of-principle experiment.
Figure 6A:
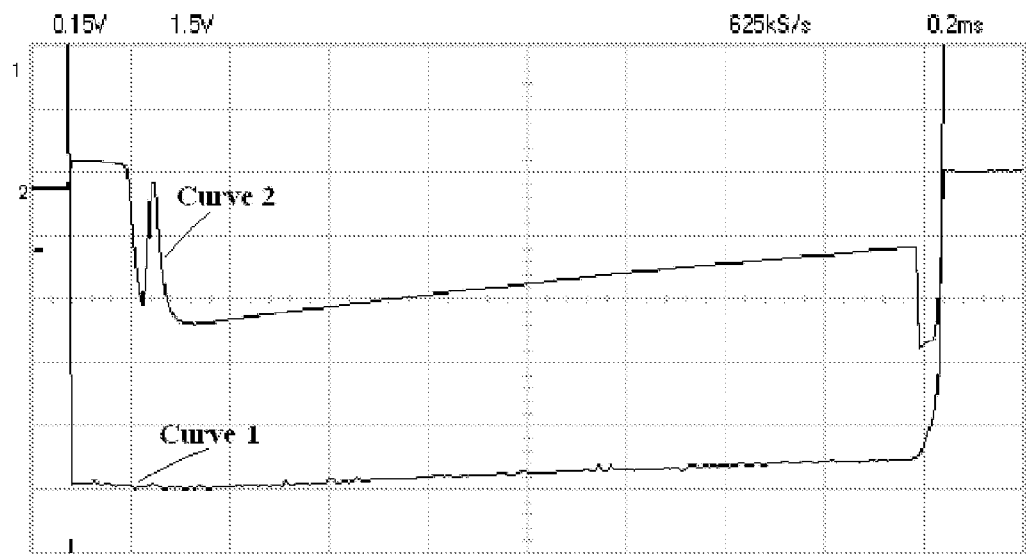
FIG. 6a and FIG. 6b illustrate the compensation action when the total capacitance of the MC bank was varied from 3 μf to 6 μf, respectively.
Figure 6B:
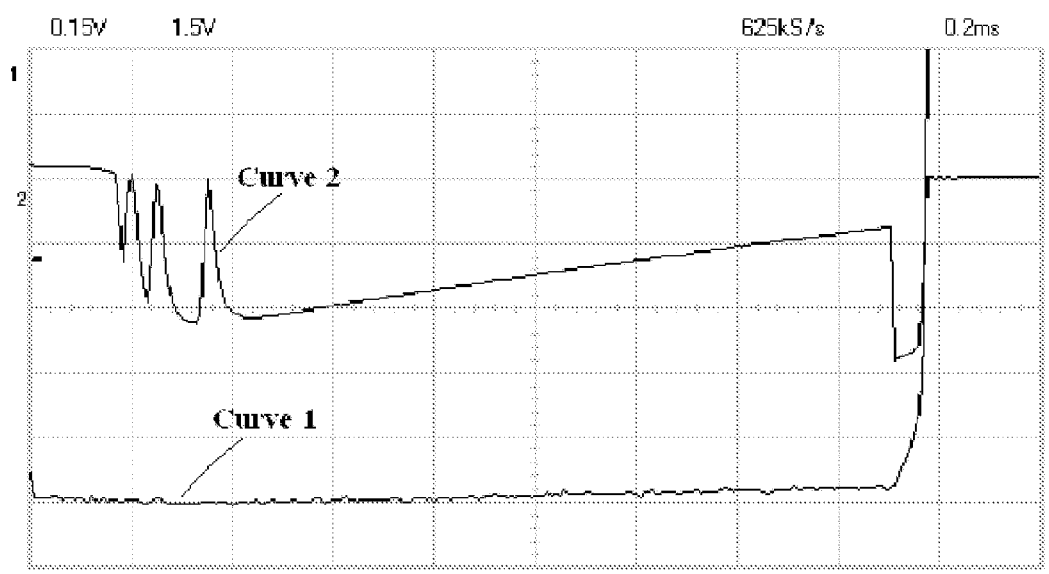

FIG. 5 shows the compensation voltage curve, i.e. output by the single HVCC and regulated by the computer, observed in the experiments. The overall voltage pulse was 1.7 ms long and the pulse amplitude in the beginning was ~62 V high. The horizontal axis in FIG. 5 is time (same in the following FIGS. 6a and 6b). The compensation voltage output by the HVCC (see Curve 2 in FIG. 5) made small ripples on the overall voltage pulse (see Curve 1 in FIG. 5) and maintained the overall voltage pulse level up to t=500 µs. After that, the overall voltage pulse decayed as the stored energy of the HVCC was exhausted, and from that time the HVCC main switch 32 was turned on all the way till the end of the voltage pulse.

Further experiments were conducted to obtain the relationship of the series capacitance of the MC bank to that of HVCC. Here we define the adequate compensation period, $t_a$, which refers to the time from the initial trigger on the isolated switch drive 40 of HVCC main switch 32 to the instant that the energy in the HVCC is no longer sufficient to compensate the voltage output by the MC bank (the voltage began to droop all the way from that point on). At time $t_a$, HVCC main switch 32 was turned on and remained on. From the equations above, we deduce that the adequate compensation period $t_a$ should become longer when the series capacitance of the MC bank increases because less energy is needed to compensate the voltage droop. We have observed this phenomenon during our experiments when we varied the series capacitance of the MC bank and kept other experimental conditions nearly the same. It was shown that $t_a$ was around 240 µs for the series capacitance of the MC bank at 3 µF (see FIG. 6a, where the initial voltage amplitude is ~72 V and was the same for FIG. 6b) and around 400 µs when the value was changed to 6 µF (see FIG. 6b). The observation agreed well with the prediction of the equations above.

While the invention has been described with reference to its preferred embodiments, those skilled in the art will understand that various changes may be made and equivalents may be substituted for elements thereof without departing from the true spirit and scope of the invention. In addition, many modifications may be made to adapt a particular situation or material to the teachings of the invention without departing from its essential teachings.

What is claimed is:

1. The high voltage compensation cell that is in series with a Marx cell bank of a solid-state Marx modulator, is operated during pulse flattops and is capable of being charged to the voltage level of the Marx cell in said solid-state Marx modulator so that only one charge voltage source is used for the entire solid-state Marx modulator, storing electric energy for compensating the voltage droop of the pulse flattops of said solid-state Marx modulator; said high voltage compensation cell comprises:

a first capacitor for charging to the identical voltage value of the Marx cell used in the same solid-state Marx modulator with said high voltage compensation cell so that said high voltage compensation cell can store electric energy for compensating the voltage droop of said solid-state Marx modulator; said first capacitor is connected to said single charge voltage source through external charge diodes which dictate the charge current direction of said first capacitor;

a first solid-state switch, whose one end is connected to said first capacitor and whose other end is connected to the junction of an inductor and a first diode, controlling the electric energy transfer from said first capacitor to a second capacitor under the triggering of an intelligent control system;

said inductor whose one end is connected to the junction of said first solid-state switch and said first diode, and whose other end is connected to said second capacitor, forming a compensation current circuit to enable compensation current to smoothly flow from said first capacitor, through said first solid-state switch that is controlled by said intelligent control system, to said second capacitor to counteract the voltage droop of said solid-state Marx modulator;

said first diode, whose one end is connected to the junction of said inductor and said first solid-state switch and whose other end is connected to said first capacitor, for stipulating the flow direction of the compensation current to compensate the consumed energy of said second capacitor;

said second capacitor, whose one end is connected to the junction of said inductor and a second solid-state switch and whose other end is connected to the junction of said first capacitor and said first diode, accepting the electric charges flowing from said first capacitor and discharging to the solid-state Marx modulator's load through said second solid-state switch when said second solid-state switch is turned on by said intelligent control system;

said second solid-state switch, whose one end is connected to the junction of said inductor and said second capacitor, and whose other end is connected to the junction of a second diode and a third solid-state switch; said second solid-state switch being "turned on" and "turned off" under the control of said intelligent control system;

said second diode, whose one end is connected to the junction of said second solid-state switch and said third solid-state switch, and whose other end is connected to the junction of said first capacitor, said first diode and said second capacitor, for defaulting said high voltage compensation cell when it is not used;

said third solid-state switch, whose one end is connected to the junction of said second solid-state switch and said second diode, and whose other end is connected to the junction of said first capacitor, said first diode, said second capacitor and said second diode, for charging said high voltage compensation cells and said Marx cells in series under the control of said intelligent control system;

said intelligent control system for triggering said first solid-state switch in order to regulate the amplitude and duration of the compensation current to make multiple compensation actions, for triggering said second solid-state switch for operating or isolating said high voltage compensation cell from the discharge circuit of said solid-state Marx modulator and for triggering said third solid-state switch for charging the first capacitor of other high voltage compensation cells and the capacitors of said Marx cells in series; said intelligent control system is connected to all three solid-state switches of said high voltage compensation cell for regulating the compensation function of said high voltage compensation cell.

2. The high voltage compensation cell in claim 1, wherein said first capacitor is connected with said single charge voltage source through said external charge diodes to form a charge loop and can be charged to the identical voltage value of said Marx cell in the same solid-state Marx modulator, stores high electric energy equivalent to the amount of electric energy stored in said Marx cell so that said high voltage compensation cell has the ability to release the stored energy incrementally for the compensation action.

3. The high voltage compensation cell of claim 1 operated with said intelligent control system provides variable voltage output during one voltage pulse of said solid-state Marx modulator to compensate the voltage droop of said solid-state Marx modulator.

4. The method of using a high voltage compensation cell to perform multiple compensations to the Marx cell bank of a solid-state Marx modulator during one output voltage pulse of said solid-state Marx modulator under the control of an intelligent control system; said high voltage compensation cell is comprised of said intelligent control system and the combined topologies of one buck converter and one said Marx cell, wherein the output port of the topology of said buck convert is connected to a capacitor of the topology of said Marx cell and said buck converter outputs its electrical charges stored in its capacitor to said capacitor in the topology of said Marx cell under the regulation of a solid-state switch of said buck converter; said solid-sate switch is controlled by said intelligent control system to compensate the charge loss of said capacitor in the topology of said Marx cell on the load of said solid-state Marx modulator, and said high voltage compensation cell has the ability to raise its output voltage incrementally with time during the output voltage pulse of said solid-state Marx modulator for compensating the voltage droop of said solid-state Marx modulator; said capacitor located in said buck converter as an integral part of said high voltage compensation cell is connected with external charge diodes and one single charge voltage source, and forms a charge circuit loop so that said capacitor in said buck converter can be charged to the identical voltage value of the Marx cell of said solid-state Marx modulator, through said external charge diodes, using said single high voltage charge source; said single high voltage charge source is employed for said solid-state Marx modulator that comprises of said high voltage compensation cells and said Marx cells in series.

* * * * *